(12) United States Patent
Kuramoto et al.

(10) Patent No.: US 9,018,664 B2
(45) Date of Patent: Apr. 28, 2015

(54) SEMICONDUCTOR DEVICE AND PRODUCTION METHOD THEREFOR

(71) Applicant: Nichia Corporation, Anan-shi, Tokushima (JP)

(72) Inventors: Masafumi Kuramoto, Tokushima (JP); Satoru Ogawa, Anan (JP); Miki Niwa, Anan (JP)

(73) Assignee: Nichia Corporation, Anan-Shi (JP)

( * ) Notice: Subject to any disclaimer, the term of this patent is extended or adjusted under 35 U.S.C. 154(b) by 0 days.

(21) Appl. No.: 14/144,111

(22) Filed: Dec. 30, 2013

(65) Prior Publication Data

US 2014/0110740 A1 Apr. 24, 2014

Related U.S. Application Data

(62) Division of application No. 12/691,947, filed on Jan. 22, 2010, now Pat. No. 8,642,392.

(30) Foreign Application Priority Data

Jan. 23, 2009 (JP) ................................. 2009-013713

(51) Int. Cl.
H01L 33/62 (2010.01)
H01L 33/44 (2010.01)
(Continued)

(52) U.S. Cl.
CPC ................ H01L 33/44 (2013.01); H01L 24/27 (2013.01); H01L 24/29 (2013.01); H01L 24/83 (2013.01);
(Continued)

(58) Field of Classification Search
USPC .............................................. 257/98, 99, 762
See application file for complete search history.

(56) References Cited

U.S. PATENT DOCUMENTS 2,501,563 A 3/1950 Colbert et al.
2,552,723 A 5/1951 Koury
(Continued)

FOREIGN PATENT DOCUMENTS

CN 1917202 A 2/2007
CN 1941218 A 4/2007
(Continued)

OTHER PUBLICATIONS

Chinese Office Action dated Jan. 14, 2013, for Chinese Application No. 201080005228.X.
(Continued)

Primary Examiner — Long Pham
(74) Attorney, Agent, or Firm — Birch, Stewart, Kolasch & Birch, LLP

(57) ABSTRACT

An object of the invention is to provide a method for producing a conductive member having low electrical resistance, and the conductive member is obtained using a low-cost stable conductive material composition that does not contain an adhesive. A method for producing a semiconductor device in which silver or silver oxide provided on a surface of a base and silver or silver oxide provided on a surface of a semiconductor element are bonded, includes the steps of arranging a semiconductor element on a base such that silver or silver oxide provided on a surface of the semiconductor element is in contact with silver or silver oxide provided on a surface of the base, temporarily bonding the semiconductor element and the base by applying a pressure or an ultrasonic vibration to the semiconductor element or the base, and permanently bonding the semiconductor element and the base by applying heat having a temperature of 150 to 900° C. to the semiconductor device and the base.

16 Claims, 1 Drawing Sheet

(51) Int. Cl.
*H01L 23/00* (2006.01)
*H01L 23/08* (2006.01)
*H01L 23/29* (2006.01)
*H01L 23/495* (2006.01)
*H01S 5/022* (2006.01)

(52) U.S. Cl.
CPC ............... *H01L 33/62* (2013.01); *H01L 24/17* (2013.01); *H01L 23/08* (2013.01); *H01L 23/293* (2013.01); *H01L 23/49579* (2013.01); *H01L 23/49582* (2013.01); *H01L 24/32* (2013.01); *H01L 2224/2712* (2013.01); *H01L 2224/2745* (2013.01); *H01L 2224/275* (2013.01); *H01L 2224/29023* (2013.01); *H01L 2224/29083* (2013.01); *H01L 2224/29139* (2013.01); *H01L 2224/29187* (2013.01); *H01L 2224/2919* (2013.01); *H01L 2224/29339* (2013.01); *H01L 2224/45144* (2013.01); *H01L 2224/83055* (2013.01); *H01L 2224/83075* (2013.01); *H01L 2224/83201* (2013.01); *H01L 2224/83203* (2013.01); *H01L 2224/83205* (2013.01); *H01L 2224/83207* (2013.01); *H01L 2224/83439* (2013.01); *H01L 2224/83487* (2013.01); *H01L 2224/8384* (2013.01); *H01L 2224/83894* (2013.01); *H01L 2224/83895* (2013.01); *H01L 2224/83896* (2013.01); *H01L 2224/83907* (2013.01); *H01L 2924/01004* (2013.01); *H01L 2924/01012* (2013.01); *H01L 2924/01013* (2013.01); *H01L 2924/01014* (2013.01); *H01L 2924/0102* (2013.01); *H01L 2924/01022* (2013.01); *H01L 2924/01025* (2013.01); *H01L 2924/01027* (2013.01); *H01L 2924/01029* (2013.01); *H01L 2924/0103* (2013.01); *H01L 2924/01032* (2013.01); *H01L 2924/01033* (2013.01); *H01L 2924/01038* (2013.01); *H01L 2924/01047* (2013.01); *H01L 2924/01049* (2013.01); *H01L 2924/0105* (2013.01); *H01L 2924/01056* (2013.01); *H01L 2924/01057* (2013.01); *H01L 2924/01058* (2013.01); *H01L 2924/01063* (2013.01); *H01L 2924/01064* (2013.01); *H01L 2924/01074* (2013.01); *H01L 2924/01078* (2013.01); *H01L 2924/01079* (2013.01); *H01L 2924/01082* (2013.01); *H01L 2924/01105* (2013.01); *H01L 2924/01322* (2013.01); *H01L 2924/04941* (2013.01); *H01L 2924/0541* (2013.01); *H01L 2924/09701* (2013.01); *H01L 2924/12035* (2013.01); *H01L 2924/14* (2013.01); *H01L 2924/15747* (2013.01); *H01L 2924/1576* (2013.01); *H01L 2924/15787* (2013.01); *H01L 2924/1579* (2013.01); *H01L 2924/19041* (2013.01); *H01L 2924/19043* (2013.01); *H01L 2924/201* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01); *H01L 2924/2011* (2013.01); *H01L 2924/20111* (2013.01); *H01L 2924/3025* (2013.01); *H01L 2933/0066* (2013.01); *H01S 5/0226* (2013.01); *H01L 2924/0132* (2013.01); *H01L 2924/01005* (2013.01); *H01L 2924/01006* (2013.01); *H01L 2924/01019* (2013.01); *H01L 2924/01024* (2013.01); *H01L 2924/0104* (2013.01); *H01L 2924/01045* (2013.01); *H01L 2924/014* (2013.01); *H01L 2924/0665* (2013.01); *H01L 2224/29101* (2013.01); *H01L 2224/16225* (2013.01); *H01L 2224/2908* (2013.01); *H01L 2224/29111* (2013.01); *H01L 2224/32225* (2013.01); *H01L 2924/01028* (2013.01); *H01L 2924/00014* (2013.01); *H01L 2224/16* (2013.01); *H01L 2224/8383* (2013.01); *H01L 24/45* (2013.01); *H01L 2224/73265* (2013.01)

(56) References Cited

U.S. PATENT DOCUMENTS

| | | | |
|---|---|---|---|
| 3,657,611 | A | 4/1972 | Yoneda |
| 7,276,185 | B2 | 10/2007 | Totokawa et al. |
| 2001/0050370 | A1 | 12/2001 | Sakamoto et al. |
| 2001/0052600 | A1 | 12/2001 | Sakamoto et al. |
| 2004/0214418 | A1 | 10/2004 | Noda et al. |
| 2006/0065901 | A1 | 3/2006 | Aoyagi et al. |
| 2007/0040954 | A1 | 2/2007 | Lee et al. |
| 2007/0074391 | A1 | 4/2007 | Totokawa et al. |
| 2007/0079665 | A1 | 4/2007 | Sasaki et al. |
| 2007/0092987 | A1 | 4/2007 | Kim |
| 2007/0154561 | A1 | 7/2007 | Takeda et al. |
| 2008/0138238 | A1 | 6/2008 | Sasaki et al. |
| 2008/0156398 | A1 | 7/2008 | Yasuda et al. |
| 2009/0025967 | A1 | 1/2009 | Boureghda et al. |
| 2009/0162557 | A1 | 6/2009 | Lu et al. |
| 2010/0186999 | A1 | 7/2010 | Kuramoto et al. |

FOREIGN PATENT DOCUMENTS

| | | |
|---|---|---|
| EP | 1 950 767 A1 | 7/2008 |
| GB | 1 297 046 | 11/1972 |
| JP | 6-4790 A | 1/1994 |
| JP | 6-302213 A | 10/1994 |
| JP | 8-148512 A | 6/1996 |
| JP | 10-284516 A | 10/1998 |
| JP | 10-308120 A | 11/1998 |
| JP | 11-111052 A | 4/1999 |
| JP | 2001-216839 A | 8/2001 |
| JP | 2001-325831 A | 11/2001 |
| JP | 2002-64225 A | 2/2002 |
| JP | 2003-309352 A | 10/2003 |
| JP | 2004-128330 | 4/2004 |
| JP | 2004-143325 A | 5/2004 |
| JP | 2004-253251 A | 9/2004 |
| JP | 2004-362950 A | 12/2004 |
| JP | 2005-48236 A | 2/2005 |
| JP | 2005-48237 A | 2/2005 |
| JP | 2005-93380 A | 4/2005 |
| JP | 2005-126726 A | 5/2005 |
| JP | 2005-129303 A | 5/2005 |
| JP | 2005-200604 A | 7/2005 |
| JP | 2005-267900 A | 9/2005 |
| JP | 2006-24808 A | 1/2006 |
| JP | 2006-100500 A | 4/2006 |
| JP | 2006-237141 | 9/2006 |
| JP | 2007-42301 A | 2/2007 |
| JP | 2007-53212 A | 3/2007 |
| JP | 2007-083288 | 4/2007 |
| JP | 2007-184153 A | 7/2007 |
| JP | 2007-258647 A | 10/2007 |
| JP | 2007-302953 A | 11/2007 |
| JP | 2008-177378 | 7/2008 |
| JP | 2008-208442 A | 9/2008 |
| JP | 4-347381 A | 10/2009 |
| TW | M349553 | 1/2009 |
| WO | WO 2006/126614 A1 | 11/2006 |
| WO | WO 2007/034833 A1 | 3/2007 |
| WO | WO 2009/090915 A1 | 7/2009 |

OTHER PUBLICATIONS

Extended EP Search Report issued in corresponding EP Application No. 10733350.2 on Sep. 19, 2012.
Information Offer Form mailed on Apr. 26, 2011 and its English translation.

(56) References Cited

OTHER PUBLICATIONS

Li et al., "Recent advances of conductive adhesives as a lead-free alternative in electronic packaging: Materials, processing, reliability and applications," Materials Science and Engineering, R 51, 2006, pp. 1-35.

T. Morita et al., "Bonding Technique Using Micro-Scaled Silver-Oxide Particles for In-Situ Formation of Silver Nanoparticles", Materials Transactions, vol. 49, No. 12, (2008), The Japan Institute of Metals, pp. 2875-2880.

TW Office Action dated Mar. 1, 2013 issued in corresponding Taiwanese patent application No. 099101816.

U.S. Office Action issued in U.S. Appl. No. 12/691,999 dated May 13, 2011.

Chinese Office Action and Search Report issued in Chinese Application No. 201080005228.X on Mar. 17, 2014.

European Office Action issued in European Application No. 10 733 350.2-1552 on Jun. 13, 2014.

Onuki, J. et al., "The Low Temperature Bonding Between Si and Electrode Using Sputtered Ag Films", Japanese Journal of Applied Physics, Part 1, Japan Society of Applied Physics, JP, vol. 41, No. 10, Oct. 2002, pp. 5904-5908, ISSN: 0021-4922, DOI:10.1143/JJAP.41. 5904.

European Office Action issued in European Application No. 10 733 350.2-1552 on Feb. 11, 2015.

Lavrenko V A et al., "Features of High-Temperature Oxidation in Air of Silver and Alloy Ag—Cu, and adsorption of Oxygen on Silver", Powder Metallurgy and Metal Ceramics, Kluwer Academic Publishers-Consultants Bureau, NE, vol. 45, No. 9-10, 2006, pp. 476-480, ISSN: 1573-9066, DOI: 10 1007/S11106-006-0108-8.

SEMICONDUCTOR DEVICE AND PRODUCTION METHOD THEREFOR

CROSS REFERENCE TO RELATED APPLICATIONS

This application is a divisional of co-pending application Ser. No. 12/691,947 filed on Jan. 22, 2010, which claims priority under 35 U.S.C. §119(a) to Patent Application No. 2009-013713 filed in Japan on Jan. 23, 2009. The entire contents of each of these applications are hereby incorporated by reference.

BACKGROUND OF THE INVENTION

1. Field of the Invention

The present invention relates to a semiconductor device and a production method therefor, especially, a method for bonding a semiconductor element (hereinafter sometimes referred to as a "die-attach method").

2. Description of Related Art

Various bonding methods for mounting semiconductor elements such as transistors, ICs, and LSIs have been known. In addition, various bonding methods that are suitable with, among semiconductor elements, light emitting semiconductor elements such as light emitting diodes (hereinafter sometimes referred to as "LEDs") and laser diodes (hereinafter sometimes referred to as "LDs") have been know as well.

Conventionally, die-attach methods for semiconductor elements are roughly classified into two categories, i.e., bonding methods that use epoxy resin adhesives (hereinafter referred to as "resin bonding") and bonding methods that use eutectic metals having an eutectic point at a high temperature of 300° C. or greater (hereinafter referred to as "eutectic bonding") (see, for example, Patent Documents 1 and 2). Such die-attach methods are selected according to the similarity between the thermal expansion behaviors of a lead frame material and a substrate material on which a semiconductor element is to be mounted, as well as the reliability, cost, and like factors. For example, resin bonding is used for light emitting diodes for use in liquid-crystal back lights of small portable devices and like devices whose cost is given priority, and eutectic bonding is generally used for light emitting diodes for lighting purposes that are required to last a long time and for laser diodes that are required to be highly reliable.

A resin for use in resin bonding is mostly a thermosetting resin such as an epoxy resin. A paste in which a powder of a conductive material such as silver is dispersed is also a type of resin for resin bonding. In resin bonding, a liquid epoxy resin is heated to 150 to 200° C. for curing. Resin bonding is convenient in that curing can be readily accomplished at low temperatures of 150 to 200° C. In particular, thermal degradation of the thermosetting resin and melting of the thermoplastic resin can be avoided in a general-purpose surface-mounted semiconductor device in which a lead frame is molded in advance.

However, the heat generation due to the recent increase of light energy attained by light emitting diodes, laser diodes and like devices as well as the recent increase in input electricity, causes the resin itself that is used in resin bonding to deteriorate with time, resulting in problems such as discoloration and deterioration of the bonding strength. The glass transition temperature, which is an indicator in terms of temperature of the modulus of elasticity of a resin, is, because curing is performed at a low temperature, lower than the solder mounting temperature applied when a semiconductor device is mounted as an electronic component, and thus separation resulting from deterioration of the resin strength caused by thermal shock during solder mounting is likely to occur. Moreover, resin bonding that uses only an epoxy resin and resin bonding that uses a silver paste both have a problem in that, since they have poor thermal conductivity and insufficient heat releasability, light emitting diodes and the like become unilluminable.

On the other hand, eutectic bonding that uses an alloy of gold and tin can solve the aforementioned problems of resin bonding.

However, eutectic bonding requires heating to 300° C. or greater when bonding, and is therefore not applicable to widely used resin packages of PPA (polyphthalamide) or the like since such packages cannot withstand high temperatures. In addition, even if silver plating, which has high reflectivity, is provided over the surface of a wiring board or a lead frame on which a light emitting diode is to be mounted, light extraction effect cannot be enhanced since eutectic metals have poor reflectivity.

Patent Document 1: JP 2004-128330 A
Patent Document 1: JP 2006-237141 A

SUMMARY OF THE INVENTION

Therefore, with the foregoing in mind, it is an object of the present invention to provide a method for mounting a reliable semiconductor element and to provide a method for mounting a semiconductor element that has high heat releasability. Accordingly, a low-cost semiconductor device and a simple production method of a semiconductor device can be provided.

The present invention relates to a method for producing a semiconductor device in which silver or silver oxide provided on a surface of a base and silver or silver oxide provided on a surface of a semiconductor element are bonded, and the method includes the steps of arranging the semiconductor element on the base such that silver or silver oxide provided on a surface of the semiconductor element is in contact with silver or silver oxide provided on a surface of the base, temporarily bonding the semiconductor element and the base by applying a pressure or an ultrasonic vibration to the semiconductor element or the base, and permanently bonding the semiconductor element and the base by applying heat having a temperature of 150 to 900° C. to the semiconductor device and the base. It is thus possible to provide a method for producing a reliable semiconductor device since components that are likely to deteriorate are not used. Moreover, since the semiconductor element and the base are directly bonded, the thermal conductivity is high and the heat generated by the semiconductor element can be efficiently transferred to the base. Furthermore, the semiconductor element can be mounted without special equipment, so a simple production method for a semiconductor device can be provided.

The temperature for the permanent bonding is preferably in a range of 150 to 400° C., and more preferably in a range of 150 to 320° C. This is because the bonding can be attained at relatively low temperatures. Moreover, this is because at those temperatures the semiconductor element is not destroyed, and the package in which the semiconductor element is mounted and the mounted base do not undergo thermal deformation.

It is preferable to simultaneously perform the step of temporarily bonding and the step of permanently bonding. This is because the semiconductor element can be mounted in a simpler manner.

The step of permanently bonding is performed preferably in air or in an oxygen atmosphere, thereby enabling the fusion reaction of silver to be further enhanced.

The present invention relates to a semiconductor device having a die shear strength of 13 to 55 MPa in which silver or silver oxide provided on a surface of a base and silver or silver oxide provided on a surface of a semiconductor element are directly bonded. While a resin adhesive, a silver paste, a eutectic metal, or the like is present between the base and the semiconductor element in conventional bonding such as resin bonding and eutectic bonding, the base and the semiconductor element are directly bonded in the present invention. A eutectic component that uses an alloy of gold and tin or a component such as an epoxy resin or a silver paste is not present between the semiconductor element and the base, and it is thus possible to provide a reliable semiconductor device. In particular, a semiconductor device that has a high die shear strength and that is unlikely to undergo separation can be provided.

A light emitting semiconductor element may be used for the semiconductor element. The light emitting semiconductor element and the base are directly bonded, and it is thus possible to provide a semiconductor device that does not undergo photodegradation. The present invention is applicable also to transistors, ICs, LSIs, capacitors, Zener diodes, and the like other than light emitting semiconductor elements such as light emitting diodes and laser diodes.

The semiconductor element used may include a semiconductor layer disposed on a translucent inorganic substrate; the translucent inorganic substrate is provided with first silver on the side opposite the semiconductor layer and furnished with a buffering member bonded with the first silver; and the silver or silver oxide is provided on a surface of the buffering member. It is thus possible to enhance the efficiency of extracting light from the semiconductor device. Moreover, the separation at the interface of the translucent inorganic substrate and the first silver can be reduced, thereby enhancing the die shear strength.

By adopting the above-described configuration, a low-cost reliable semiconductor device that does not include components that undergo deterioration and a production method therefor can be provided. Moreover, since the semiconductor element and the base can be directly bonded, a semiconductor device with high heat releasability can be provided. Furthermore, a simple production method for a semiconductor device can be provided.

DETAILED DESCRIPTION OF THE INVENTION

Figure 1:
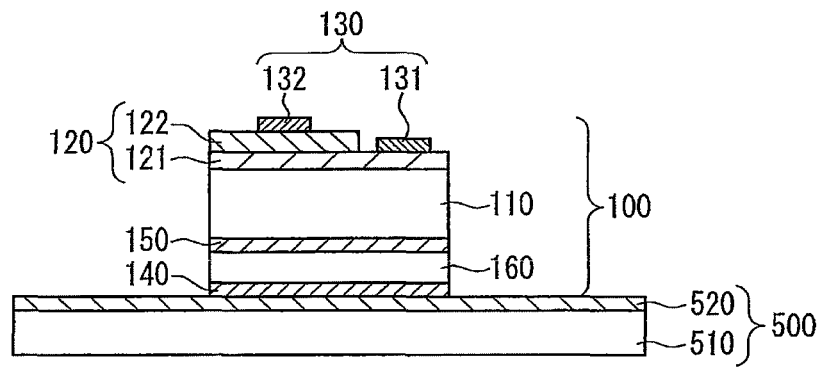
FIG. 1 is a schematic cross-sectional drawing showing the semiconductor light emitting element of the first embodiment when mounted.

The inventors found that when a composition containing silver particles having an average particle diameter of 0.1 to 15 μm is sintered in the presence of a metal oxide or in an oxygen or ozone environment or in air, which serves as an oxidizer, silver particles are fused even at a temperature, for example, near 150° C. and a conductive material can be obtained. In contrast, when a composition containing silver particles having an average particle diameter of 0.1 to 15 μm is sintered in a nitrogen environment, no conductive material was obtained at a low temperature near 150° C. Based on these findings, the inventors accomplished a method for producing a conductive material that includes the step of sintering a composition containing silver particles having an average particle diameter of 0.1 to 15 μm in the presence of a metal oxide or in an oxygen or ozone environment or in air that serves as an oxidizer.

Furthermore, the inventors, during the process of investigating the mechanism of the present invention in detail, performed low-temperature bonding of smoothed silver-sputtered surfaces in the presence of oxygen to examine the bondability of silver surfaces that are not organically contaminated, and found that, even if silver particles are not used, sufficient bonding can be attained by temporarily bonding by applying a pressure or an ultrasonic vibration to the surfaces to be bonded and then carrying out low-temperature heating. The inventors applied this finding to develop a highly reliable semiconductor device and have arrived at the present invention. The inventors found at the same time that it is useful also as a method for providing a low-cost semiconductor device.

In the die-attach method of the present invention, the mechanism of bond formation is not clear, but it can be presumed to be as follows. When silver-coated surfaces formed by silver sputtering, silver vapor deposition, silver plating, or a like technique are brought into contact in an oxygen or ozone environment or in air that serves as an oxidizer, some portions of the silver-coated surfaces are locally oxidized, and the silver oxide formed by the oxidation exchanges oxygen in a catalyst-like manner at the places of contact on the silver coated surfaces, and through repetitive redox reactions, bonds are formed. Moreover, it is also presumed that bonds are formed through the same mechanism also in an inert gas atmosphere by forming silver oxide in advance by oxidizing the silver-coated surfaces. Bonds are presumably formed through such a mechanism, and it is therefore possible to provide a highly reliable low-cost semiconductor device when a semiconductor device is produced according to the die-attach method of the present invention.

The present invention relates to a method for producing a semiconductor device in which silver or silver oxide provided on a surface of a base and silver or silver oxide provided on a surface of a semiconductor element are bonded, and the method includes the steps of arranging the semiconductor element on the base such that silver or silver oxide provided on a surface of the semiconductor element is in contact with silver or silver oxide provided on a surface of the base, temporarily bonding the semiconductor element and the base by applying a pressure or an ultrasonic vibration to the semiconductor element or the base, and permanently bonding the semiconductor element and the base by applying heat having a temperature of 150 to 900° C. to the semiconductor device and the base. The temperature applied to the semiconductor element and the base is preferably 150 to 400° C., and particularly preferably 150 to 320° C. The production method of the present invention can impart high emission efficiency to a semiconductor device that uses a light emitting semiconductor element such as a light emitting diode and a laser diode. Since no bonding material is interposed, low electrical resistance and low thermal resistance are attained, and it is thus possible to provide enhanced reliability. Moreover, since bonding can be performed in the same temperature range as in resin bonding, thermal deterioration of the plastics components used in the semiconductor device can be avoided. Since no resin is used in the bonding components, the life of the semiconductor device is extended. Furthermore, since the production process is simple and the amount of noble metal used is extremely low, a semiconductor device can be produced inexpensively.

An organic or inorganic substrate furnished with a lead frame or metallic wiring can be used as the base, and the surface of the lead frame or the surface of the metal wiring is coated with silver. A silver oxide surface can be attained by oxidizing the entire base or a part of the base on which a semiconductor element is to be mounted. Irrespective of conductive portions or insulative portions, the surface to be bonded of the semiconductor element is silver-coated as with the base. The silver coating of the surface can be converted, as with the base, into silver oxide by subjecting it to oxidizing treatment.

Mounting is performed while applying a pressure or an ultrasonic vibration to the semiconductor element or the base. The duration of the application of pressure or ultrasonic vibration depends on the condition of the silver or silver oxide surface of the base, and may be suitably determined to sufficiently attain temporary bonding. For this mounting, the base may be heated in advance to 150 to 900° C., more preferably 150 to 400° C., and still more preferably 150 to 320° C. The temporary bonding environment for silver-silver bonding is preferably an oxidizing environment containing oxygen or ozone, and more preferably air, which is inexpensive. In the case of silver-silver oxide bonding or silver oxide-silver oxide bonding, an inert gas environment that does not contain oxygen or ozone may be used, and a nitrogen environment, which is inexpensive, is preferable.

A temperature of 150 to 900° C. is applied to the temporarily bonded base and semiconductor element to increase the number of bonding points and to mutually diffuse silver, thereby allowing the bonding to be strong and enabling permanent bonding to be attained. Metal diffusion is obtained as a function of temperature, and thus, the higher the temperature, the faster the enhancement of bonding strength, but to avoid the oxidative degradation or the melting of plastic components used in the semiconductor device it is desirable to set the upper limit near 320° C., below which general-purpose thermoplastic resins do not melt. Note that, when a ceramics substrate or the like that is heat resistant is used for the base, the temperature can be increased to nearly 400° C. For the lower-limit temperature, 150° C. or a higher temperature is needed to obtain strong bonding within a practical time span.

It is preferable to simultaneously perform the step of temporarily bonding and the step of permanently bonding. The semiconductor element is mounted on the base while applying a pressure or a ultrasonic vibration, and then a temperature of 150 to 900° C., preferably 150 to 400° C., and more preferably 150 to 320° C. is applied to increase the number of bonding points and to mutually diffuse silver, thereby enabling strong bonding to be created. In this manner, the number of bonding points is greatly increased, and the enhancement of bonding strength can thus be expected.

It is preferable that the step of permanently bonding is performed in air or in an oxygen environment. The environment in which heat is applied to perform permanent bonding is preferably in air or in an oxygen environment. This is because an increase in the number of bonding points and, hence, an enhancement of the bonding strength can be expected. In particular, the permanent bonding environment for silver-silver bonding is preferably an oxidizing environment containing oxygen or ozone, and more preferably air, which is inexpensive. In the case of silver-silver oxide bonding or silver oxide-silver oxide bonding, an inert gas environment may be selected, and a nitrogen environment, which is inexpensive, is preferable.

The present invention relates to a semiconductor device having a die shear strength of 13 to 55 MPa in which silver or silver oxide provided on a surface of the base and silver or silver oxide provided on a surface of the semiconductor element are directly bonded. The die shear strength is dependent on the heating temperature and the heating time during bonding, and the higher the temperature and the longer the time, the higher the strength, but the lower the temperature and the shorter the time, the more advantageous it is when the production costs and the oxidative degradation of plastic components used in the semiconductor device are taken into consideration. Therefore, the die shear strength can be controlled by selecting a heating temperature of 150 to 900° C., preferably 150 to 400° C., and more preferably 150 to 320° C., and suitably selecting a heating time. Practically, the semiconductor device needs to withstand a ultrasonic shock during wire bonding and a thermal shock test performed thereon, and a die shear strength of 13 MPa or greater is required, and the upper limit preferably is 55 MPa at which the die shear strength reaches saturation during permanent bonding performed by heating at 320° C. To secure the reliability of the semiconductor device and to lessen the deterioration of the initial properties thereof, the die shear strength is more preferably 13 MPa to 35 MPa.

A light emitting semiconductor element can be used for the semiconductor element. Silver reflects more visible light than any other metal, and providing a silver coating on a surface of the semiconductor element also serves to furnish the semiconductor element with a high-efficiency reflector, creating a configuration highly suitable in a light emitting semiconductor element. Moreover, providing a silver coating on a surface of the base allows the entire semiconductor device to have a reflector-like structure, and it is thus possible to extract light even more efficiently. The translucent inorganic substrate used in the light emitting semiconductor element, since it absorbs very little light, can contribute to producing a light emitting semiconductor element that has a high emission efficiency. In the light emitting semiconductor element, a light emitting layer that is a semiconductor layer is disposed on the upper surface of the translucent inorganic substrate, the light emitting semiconductor element is arranged such that the light emitting layer becomes the upper surface, and silver or silver oxide is provided on the lower surface on the side opposite the translucent inorganic substrate. It is thus possible to highly efficiently reflect the light emitted from the light emitting layer and to obtain a semiconductor device having a large emission intensity.

In the semiconductor element, the semiconductor layer is disposed on the translucent inorganic substrate, and the translucent inorganic substrate is provided with first silver on the side opposite the semiconductor layer and furnished with a buffering member that is bonded with the first silver. A buffering member on a surface of which is provided with silver or silver oxide may be used. Formation of the first silver between the outermost silver or silver oxide and the translucent inorganic substrate can enhance the light reflectivity and thus enhance the emission intensity of the semiconductor device. One or more layers of the buffering member are provided between the first silver and the outermost silver or silver oxide. Various buffering members can be selected according to the material of the base and the material of the translucent inorganic substrate, and various inorganic materials and various organic materials can be used. Use of the buffering member reduces or alleviates the stress generated between the translucent inorganic substrate and the base, and it is thus possible to enhance bonding reliability and prevent cracks in the translucent inorganic substrate.

Semiconductor Device

Semiconductor Device of the First Embodiment

An example of the semiconductor device of the first embodiment is described with reference to a drawing. FIG. 1 is a schematic cross-sectional drawing showing the semiconductor light emitting element of the first embodiment when mounted. A description is given with reference to a light emitting semiconductor element that uses a light emitting diode as a semiconductor element, but the present invention is applicable also to transistors, ICs, LSIs, and the like other than light emitting semiconductor elements.

In the semiconductor device, silver or silver oxide 520 provided on a surface of a base 500 and silver or silver oxide 140 provided on a surface of a light emitting semiconductor element 100 are directly bonded.

The light emitting semiconductor element 100 includes a translucent inorganic substrate 110, a semiconductor layer 120 that emits light, an electrode 130 disposed on the semiconductor layer 120, first silver 150 provided on the side opposite the side on which the semiconductor layer 120 is disposed, a buffering member 160 bonded with the first silver, and the silver or silver oxide 140 provided on a surface of the buffering member. In the semiconductor layer 120, an n-type semiconductor layer 121 is stacked on the translucent inorganic substrate 110 and a p-type semiconductor layer 122 is stacked on the n-type semiconductor layer 121. In the electrode 130, an n-type electrode 131 is disposed on the n-type semiconductor 121, and a p-type electrode 132 is disposed on the p-type semiconductor 122. The light emitting semiconductor element 100 employs a flip chip structure that has the n-type electrode 131 and the p-type electrode 132 on the same side. One or more layers of the silver or silver oxide 140 may be provided on a surface of the light emitting semiconductor element 100. Moreover, the thickness of the silver or silver oxide 140 provided on a surface of the light emitting semiconductor element 100 is not particularly limited, but preferably is about 0.1 to 50 µm. It is preferable to provide the first silver 150 to efficiently reflect the light of the semiconductor layer 120. The thickness of the first silver 150 can be suitably selected insofar as 85% or greater and preferably 90% or greater of light can be reflected, e.g., 0.05 µm or greater.

The buffering member 160 can reduce or alleviate the bonding stress generated due to the difference between the mechanical properties of the translucent inorganic substrate 110 and the base 500. Various inorganic materials and organic materials can be used for the buffering member 160, and multiple layers of such materials may be formed. A great reduction in the stress that is generated during bonding can be expected with the use of an organic polymeric material for the buffering member 160. Lest the exposed end portions of the buffering member 160 undergo photodegradation, an inorganic material is more preferable.

The silver or silver oxide 140 can be disposed below the buffering member 160, thereby allowing it to be bonded with the silver or silver oxide 520 provided on a surface of the base 500. For the silver and silver oxide 140, use of silver oxide allows bonding to be accomplished in an inert gas environment. Moreover, use of silver oxide can prevent sulfuration and give storage stability to the light emitting semiconductor element before being bonded. Silver oxide can be provided in such a manner that, first, silver is applied to the buffering member 160 and then oxidized by oxygen plasma, UV irradiation, or a like technique, thereby giving silver oxide.

Note that, the silver or silver oxide 140 may be provided directly on the translucent inorganic substrate 110. Furthermore, the silver or silver oxide 140 is not necessarily provided in the form of a single layer and may be provided in the form of multiple layers composed of two or more layers. Using the silver or silver oxide 140 in different thicknesses or compositions, the bondability with the translucent inorganic substrate 110 can be enhanced.

In the base 500, the silver or silver oxide 520 is provided on a surface of a pedestal 510. The pedestal 510 may be conductive or insulative. An example of a conductive member used for the pedestal 510 includes a lead frame made of copper, iron, or a like material. If silver is used for the pedestal 510, it is not necessary to provide the silver or silver oxide 520 and the pedestal 510 serves as the base 500.

On the other hand, examples of an insulative member used for the pedestal 510 include a glass epoxy board, a resin component such as polyphthalamide or a liquid-crystal polymer, a ceramics component, and a like material. In the case where such an insulative member is used for the pedestal 510, desired circuit wiring is installed on a glass epoxy board and the silver or silver oxide 520 is provided on the circuit wiring.

For the silver and silver oxide 520 to be disposed on the pedestal 510, use of silver oxide allows bonding to be accomplished in an inert gas environment. Silver oxide can be provided in such a manner that, first, silver is applied to the pedestal 510 and then oxidized by oxygen plasma, UV irradiation, or a like technique, thereby giving silver oxide. Only a portion on which the light emitting semiconductor element 100 is to be mounted may be oxidized. Silver oxide can be provided in such a manner that, first, silver is applied to the buffering member 160 and then oxidized by oxygen plasma, UV irradiation, or a like technique, thereby giving silver oxide.

The base 500 can take a variety of shapes such as a flat plate shape and a cup shape. For the ease of mounting the light emitting semiconductor element 100, a base 500 in the shape of a flat plate is preferable. To enhance the efficiency of extracting light from the light emitting semiconductor element 100, the base 500 can take the shape of a cup. In the case where the base 500 is cup-shaped, part of the conductive wiring can be exposed exterior of the base 500 as a terminal. Semiconductor light emitting elements having the same function and semiconductor elements having different functions can be mounted on the base 500. An electronic element such as a resistive element and a capacitor may also be mounted on the base 500.

Wiring with a gold wire or the like is provided on the electrode 130 disposed on the light emitting semiconductor element 100 to attain a desired electrical connection. The light emitting semiconductor element 100 is encapsulated in an encapsulating member that contains a fluorescent material, a filler, a light diffusing member, or the like that absorbs the light emitted from the light emitting semiconductor element 100 and converts the wavelength thereof into a different wavelength, thereby giving a semiconductor device.

The die shear strength preferably is 13 to 55 MPa. Accordingly, the semiconductor element and the base can be bonded firmly.

Method for Producing Semiconductor Device

The light emitting semiconductor element 100 is mounted on the base 500 such that the silver or silver oxide 140 provided on a surface of the light emitting semiconductor element 100 is brought into contact with the silver or silver oxide 520 provided on a surface of the base 500. No solder, resin, or the like is present between the silver or silver oxide 520 provided on a surface of the base 500 and the silver or silver oxide 140 provided on a surface of the light emitting semiconductor element 100. In the base 500, the pedestal 510 is provided with desired circuit wiring, and the silver or silver oxide 520 is provided on the outermost surface of the circuit wiring. In connection with the positioning of the light emitting semiconductor element 100, the circuit wiring may have various shapes, for example, circuit wiring having a shape identical to the contour of the light emitting semiconductor element 100 can be formed, circuit wiring having a shape slightly smaller than but approximately identical to the contour of the light emitting semiconductor element 100 can be formed, or approximately square circuit wiring whose vertices extend to the four corners of the light emitting semiconductor element 100 can be formed.

The light emitting semiconductor element 100 and the base 500 are temporarily bonded by applying a pressure or a ultrasonic vibration to the light emitting semiconductor element 100 or the base 500. A specific pressure or ultrasonic vibration may be applied during the mounting of the light emitting semiconductor element 100 on the base 500, or a specific pressure or ultrasonic vibration may be applied by a separate machine after the mounting of the light emitting semiconductor element 100 on the base 500. Although the pressure applied when the light emitting semiconductor element 100 and the base 500 are temporarily bonded is preferably 5 to 50 MPa and more preferably 10 to 20 MPa, pressures the light emitting semiconductor element 100 can withstand are acceptable. A temperature of 150 to 400° C. may be applied in advance to the light emitting semiconductor element 100 and the base 500 while temporarily bonding. Although a longer duration is more preferable, the necessary duration of the step of temporarily bonding is not particularly limited and about 0.1 to 60 seconds is sufficient.

The light emitting semiconductor element 100 and the base 500 are permanently bonded by applying a temperature of 150 to 900° C. to the light emitting semiconductor element 100 and the base 500. The step of temporarily bonding and the step of permanently bonding can be performed simultaneously. The temperature applied to the light emitting semiconductor element 100 and the base 500 preferably is 150° C. or greater at which strong bonding can be attained. The temperature is not particularly limited insofar as the light emitting semiconductor element 100 can withstand the temperature, and it may be no greater than 900° C., which is lower than the melting point of silver, and no greater than 400° C. or less is preferable. Moreover, a temperature of no greater than 320° C., which the light emitting semiconductor element 100 and a packaging can withstand, is particularly preferable. The step of permanently bonding can be performed also in air or in an oxygen environment. In the case where the silver 140 is used on a surface of the light emitting semiconductor element 100 and the silver 520 is used on a surface of the base 500, permanent bonding is performed in an oxygen environment. In the case where the silver 140 is used on a surface of the light emitting semiconductor element 100 and the silver oxide 520 is used on a surface of the base 500 and in the case where the silver oxide 140 is used on a surface of the light emitting semiconductor element 100 and the silver or silver oxide layer 520 is used on a surface of the base 500, permanent bonding in both cases can be performed in an inert gas environment such as a nitrogen environment, and it can be performed also in air or in an oxygen environment. Although a longer duration is more preferable, the necessary duration of the step of permanently bonding is also not particularly limited and about 1 second to 24 hours is sufficient.

Note that, since the melting point of silver is 961° C., sintering is performed in the present production process at a temperature of no greater than 900° C., which is lower than the melting point of silver, and a temperature of 150 to 400° C. in particular is a very low temperature.

After the light emitting semiconductor element 100 is mounted on the base 500, wires are connected and encapsulation in an encapsulating member is performed, thereby giving a semiconductor device.

Semiconductor Device of the Second Embodiment

Figure 2:
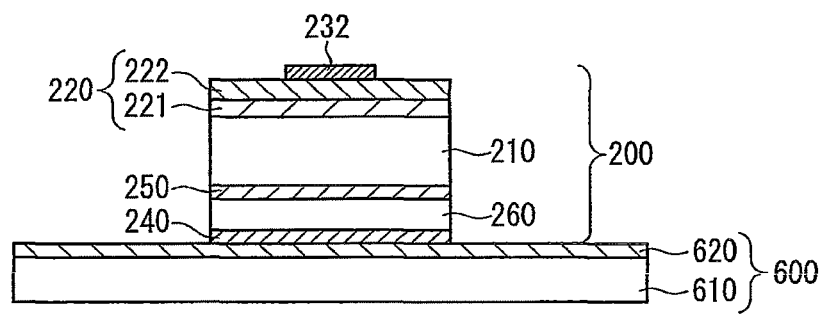
FIG. 2 is a schematic cross-sectional drawing showing the semiconductor light emitting element of the second embodiment when mounted.

An example of the semiconductor device of the second embodiment is described with reference to a drawing. FIG. 2 is a schematic cross-sectional drawing showing the semiconductor light emitting element of the second embodiment when mounted. The semiconductor device of the second embodiment has substantially the same configuration as the semiconductor device of the first embodiment except for the light emitting semiconductor element, and some descriptions may be omitted.

In the semiconductor device, silver or silver oxide 620 provided on a surface of a base 600 and silver or silver oxide 240 provided on a surface of a light emitting semiconductor element 200 are bonded.

The light emitting semiconductor element 200 includes a translucent inorganic substrate 210, a semiconductor layer 220 that emits light, a p-type electrode 232 disposed on the semiconductor layer 220, first silver 250 provided on the side opposite the side on which the semiconductor layer 220 is disposed, a buffering member 260 bonded with the first silver 250, and the silver or silver oxide 240 provided on a surface of the buffering member 260. The bottom part of the translucent inorganic substrate 210 serves as an n-type electrode. In the semiconductor layer 220, an n-type semiconductor layer 221 is stacked on the translucent inorganic substrate 210 and a p-type semiconductor layer 222 is stacked on the n-type semiconductor layer 221. The light emitting semiconductor element 200 includes the n-type electrode on the lower-surface side (bottom part of the translucent inorganic substrate 210) and the p-type electrode 232.

In the base 600, the silver or silver oxide 620 is provided on a conductive or insulative pedestal 610.

In this manner, even for the light emitting semiconductor element 200, which has such a configuration that the electrodes are disposed on the upper and lower surfaces, the silver or silver oxide layer 620 provided on the base 600 can be firmly bonded under specific conditions with the silver or silver oxide layer 240 by providing the silver or silver oxide layer 240 on the outermost lower surface of the light emitting semiconductor element 200 on which mounting is performed.

Semiconductor Device of the Third Embodiment

Figure 3:
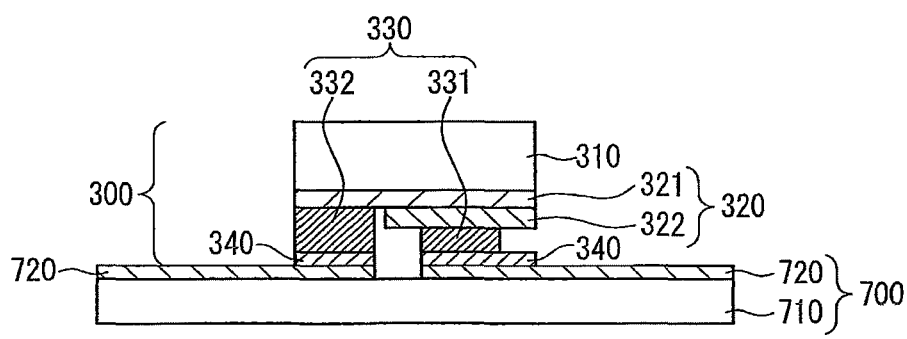
FIG. 3 is a schematic cross-sectional drawing showing the semiconductor light emitting element of the third embodiment when mounted.

An example of the semiconductor device of the third embodiment is described with reference to a drawing. FIG. 3 is a schematic cross-sectional drawing showing the semiconductor light emitting element of the third embodiment when mounted. The semiconductor device of the second embodiment have substantially the same configuration as the semiconductor device of the first embodiment except for the light emitting semiconductor element, and some descriptions may be omitted.

In the semiconductor device, silver or silver oxide 720 provided on a surface of a base 700 and silver or silver oxide 340 provided on a surface of a light emitting semiconductor element 300 are bonded.

The light emitting semiconductor element 300 includes a translucent inorganic substrate 310, a semiconductor layer 320 that emits light, an electrode 330 disposed on the semiconductor layer 320, and silver or silver oxide 340 provided on the electrode 330. In the semiconductor layer 320, an n-type semiconductor layer 321 is stacked on the translucent inorganic substrate 310 and a p-type semiconductor layer 322 is stacked on the n-type semiconductor layer 321. In the electrode 330, an n-type electrode 331 is disposed on the n-type semiconductor layer 321, and a p-type electrode 332 is disposed on the p-type semiconductor layer 322. The light emitting semiconductor element 300 employs a flip chip structure that has the n-type electrode 331 and the p-type electrode 332 on the same side and is mounted facedown. The n-type electrode 331 and the p-type electrode 332 are both provided on their surfaces with silver or silver oxide 340. It is preferable that the silver or silver oxide 340 covers the entire surfaces of the n-type electrode 331 and the p-type electrode 332, but the silver or silver oxide layer 340 may be applied only to the portion that is brought into contact with the base 700. One or more layers of the silver or silver oxide 340 may be provided on a surface of the light emitting semiconductor element 300. Moreover, the thickness of the silver or silver oxide 340 provided on a surface of the light emitting semiconductor element 300 is not particularly limited, and preferably is about 0.1 to 50 µm. In order to mount the light emitting semiconductor element 300 facedown, it is preferable to adjust the heights of the n-type electrode 331 and the p-type electrode 332 such that the translucent inorganic substrate 310 is disposed approximately parallel to the base.

In the base 700, a desired circuit pattern is provided on an insulative mount 710, and the silver or silver oxide 720 is provided on the circuit pattern.

In this manner, even for the light emitting semiconductor element 300, which has such a configuration that the n-type electrode 331 and the p-type electrode 332 are disposed on the same side and is mounted facedown, the silver or silver oxide layer 720 provided on the base 700 can be firmly bonded under specific conditions with the silver or silver oxide layer 340 by providing the silver or silver oxide layer 340 on the n-type electrode 331 and the p-type electrode 332. In particular, since no solder bumps are used, bonding can be achieved without creating a short circuit even when the distance between the n-type electrode 331 and the p-type electrode 332 is small.

The method for producing the semiconductor device of the third embodiment is also nearly the same as the method for producing the semiconductor device of the first embodiment except that no step of wire connection is needed after the bonding of the light emitting semiconductor element 300 and the base 700.

Semiconductor Element

For the semiconductor element, in addition to light emitting semiconductor elements such as light emitting diodes and laser diodes, transistors, ICs, LSIs, Zener diodes, capacitors, light receiving elements, and the like can be used.

In the light emitting semiconductor element, a semiconductor layer is stacked on an inorganic substrate. The inorganic substrate preferably is translucent. Sapphire, GaP, GaN, ITO, ZnO, inorganic glass, ceramics, and the like can be used for the translucent inorganic substrate, and a semiconductor such as GaAlN, ZnS, ZnSe, SiC, GaP, GaAlAs, AlN, InN, AlInGaP, InGaN, GaN, or AlInGaN processed into a light emitting layer is used for the semiconductor layer. The structure of the semiconductor may be a homostructure, a heterostructure, or a double heterostructure, that has an MIS junction, a PIN junction, or a PN junction. Various emission wavelengths, from ultraviolet light to infrared light, can be selected according to the material of the semiconductor layer and the composition of the mixed crystals thereof. The light emitting layer may have a single quantum well structure or a multiple quantum well structure in the form of a thin film that exhibits a quantum effect.

If outdoor use or use in a like environment is considered, a gallium nitride compound semiconductor preferably is used for a semiconductor layer that can form a high-intensity light emitting semiconductor element, and a gallium/aluminium/arsenic semiconductor layer and an aluminium/indium/gallium/phosphorus semiconductor layer preferably are used to create red, and various semiconductors can be used depending on the application.

In the case where a gallium nitride compound semiconductor is used for the semiconductor layer, materials such as sapphire, spinel, SiC, Si, ZnO, and GaN are used for the translucent inorganic substrate. It is preferable to use sapphire for the translucent inorganic substrate to produce highly crystalline gallium nitride that can easily be mass produced. In the case where the light emitting semiconductor element is used facedown, the translucent inorganic substrate is required to have high translucency.

Although the electrode preferably is of a material that does not block light, a light blocking material can also be used. In the case where the light emitting semiconductor element is provided with an n-type electrode and a p-type electrode on the same side, it is preferable that the p-type electrode is provided to occupy a large area of the semiconductor layer.

In the case where the light emitting semiconductor element is provided with an n-type electrode and a p-type electrode on the upper and lower surfaces, it is preferable that the electrode on the side that is brought into contact with the base is provided so as to occupy a large area, and it is particularly preferable that the electrode is provided so as to occupy nearly the entire lower surface. The electrode on the side that is brought into contact with the base preferably is covered with silver or silver oxide.

The translucent p-type electrode may be formed as a thin film having a thickness of 150 µm or less. Moreover, non-metal materials such as ITO and ZnO can also be used for the p-type electrode. Here, in place of the translucent p-type electrode, an electrode that has a plurality of openings for light extraction, such as a mesh electrode, may be used.

In addition to a linear shape, the electrode may take, for example, a curved, whisker, comb, lattice, branch, hook, or network shape. The light blocking effect is increased proportional to the total area of the p-type electrode, it is thus preferable to design the line width and length of an extended conductive part such that the light emission enhancing effect is not overwhelmed by the light blocking effect. Metals such as Au and Au—Sn as well as non-metal materials such as ITO and ZnO can be used for the p-type electrode. In place of the translucent p-type electrode, an electrode that has a plurality of openings for light extraction, such as a mesh electrode, may be used. The size of the light emitting semiconductor element may be suitably selected.

The buffering member of the light emitting semiconductor element preferably contains at least one inorganic material, other than silver and silver oxide, selected from the group consisting of gold, copper, aluminium, tin, cobalt, iron, indium, tungsten and like metals as well as alloys thereof, silica, alumina, zirconium oxide, titanium oxide, and like oxides; and aluminium nitride, zirconium nitride, titanium nitride, and like nitrides. The buffering member of the light emitting semiconductor element preferably contains at least one organic material selected from the group consisting of an epoxy resin, a silicone resin, a modified silicone resin, a polyimide resin, and like insulative resins; and conductive resins that are produced by filling such insulative resins with large amounts of metal powder.

If silver oxide is to be provided on the outermost surface of the semiconductor element, silver is applied first and then oxidized by oxygen plasma, UV irradiation, or a like technique, thereby giving silver oxide. The formation of silver oxide allows bonding to be achieved in an inert gas environment. The sulfuration of silver can be prevented.

Base

In the base, silver or silver oxide is provided on a surface of the pedestal. A ceramic substrate containing aluminium oxide, aluminium nitride, zirconium oxide, zirconium nitride, titanium oxide, titanium nitride, or a mixture of these, a metal substrate containing Cu, Fe, Ni, Cr, Al, Ag, Au, Ti, or an alloy of these, a lead frame, a glass epoxy board, a BT resin substrate, a glass substrate, a resin substrate, paper, and the like can be used for the base. An example of the lead frame is a metal frame formed from copper, iron, nickel, chromium, aluminium, silver, gold, titanium, or an alloy of these, and a metal frame formed from copper, iron, or an alloy of these is preferable. More preferably, the lead frame is of a copper alloy in the case of a semiconductor device that needs to have heat releasability, and of an iron alloy in the case of a semiconductor device in which the semiconductor element needs to be reliably bonded. In the case where silver or silver oxide is used in the portion corresponding to the pedestal of the base, it is not necessary to further provide silver or silver oxide.

The surface of the wiring board or the lead frame may be coated with silver, silver oxide, silver alloy, silver alloy oxide, Pt, Pt alloy, Sn, Sn alloy, gold, gold alloy, Cu, Cu alloy, Rh, Rh alloy, or the like, and the outermost surface of the portion on which the semiconductor element is to be mounted is coated with silver or silver oxide. Coating with such materials can be performed by plating, vapor deposition, sputtering, printing, applying, or a like technique.

A resin package may be used for the base. A package in which a lead is molded integrally and a package in which circuit wiring is created by plating or a like technique after package molding may be usable. The package can take a variety of shapes such as a cup shape and a flat plate shape. An electrically insulative resin that has excellent light resistance and heat resistance is suitably used for the resin that forms the package and, for example, a thermoplastic resin such as polyphthalamide, a thermosetting resin such as an epoxy resin, glass epoxy, and ceramics can be used. Moreover, to efficiently reflect the light emitted from the light emitting semiconductor element, a white pigment such as titanium oxide can be added to such resins. Usable methods of package molding include insert molding in which a lead is placed in advance in a metal mold, injection molding, extrusion molding, transfer molding, and the like.

Encapsulating Member

An encapsulating member is used to protect the semiconductor device mounted on the base from external forces, dust, etc. Also, the encapsulating member can let the light emitted from the light emitting semiconductor element efficiently pass through outwardly. Examples of resins used for the encapsulating member include an epoxy resin, a phenolic resin, an acrylic resin, a polyimide resin, a silicone resin, a urethane resin, a thermoplastic resin, and the like. In particular, a silicone resin is preferable since a long-lasting semiconductor device that has excellent heat resistance and light resistance can be produced. For an airtight cover or a non-airtight cover, inorganic glass, a polyacrylic resin, a polycarbonate resin, a polyolefin resin, a polynorbornene resin, and the like can be mentioned. In particular, inorganic glass is preferable since a long-lasting semiconductor device that has excellent heat resistance and light resistance can be produced.

Others

The encapsulating member may contain a fluorescent material, a filler, a light diffusing member, and the like. The fluorescent material may be any material that absorbs the light emitted from the light emitting semiconductor element and emits a fluorescence having a wavelength different from that of the light, and preferably is at least one member selected from a nitride phosphor or an oxynitride phosphor that is activated primarily by a lanthanoid element such as Eu or Ce; an alkaline earth halogen apatite phosphor, a halogenated alkaline earth metal borate phosphor, an alkaline earth metal aluminate phosphor, an alkaline earth silicate phosphor, an alkaline earth sulfide phosphor, an alkaline earth thiogallate phosphor, an alkaline earth silicon nitride phosphor, and a germanate phosphor that are activated primarily by a lanthanoid element such as Eu or a transition metal element such as Mn; a rare earth aluminate phosphor and a rare earth silicate phosphor that are activated primarily by a lanthanoid element such as Ce; and organic and inorganic complexes that are activated primarily by a lanthanoid element such as Eu; and the like. More preferably, $(Y,Gd)_3(Al,Ga)_5O_{12}$:Ce, $(Ca,Sr,Ba)_2SiO_4$:Eu, $(Ca,Sr)_2Si_5N_8$:Eu, $CaAlSiN_3$:Eu, and the like are used.

For the filler, alumina, silica, tin oxide, zinc oxide, titanium oxide, magnesium oxide, silicon nitride, boron nitride, aluminium nitride, potassium titanate, mica, calcium silicate, magnesium sulfate, barium sulfate, aluminium borate, glass flake, and glass fiber can be used. In addition, silicone rubber particles and silicone elastomer particles can be used for stress relaxation. The light transmittance is greatly influenced by the diameter of the filler particles, and the average particle diameter preferably is 5 μm or greater, but nanoparticles can also be used. It is thus possible to greatly enhance the translucency and light dispersibility of the encapsulating member.

For the light diffusing member, alumina, silica, tin oxide, zinc oxide, titanium oxide, magnesium oxide, silicon nitride, boron nitride, aluminium nitride, potassium titanate, mica, calcium silicate, magnesium sulfate, barium sulfate, aluminium borate, glass flake, and glass fiber can be used. In addition, particles of thermosetting resins such as an epoxy resin, a silicone resin, a benzoguanine resin, and a melamine resin can be used. The light diffusibility is greatly influenced by the diameter of the filler particles, and the average particle diameter preferably is in a range of 0.1 to 5 μm. It is thereby possible to attain light diffusion with a smaller amount of light diffusing member.

The semiconductor element can be coated with the fluorescent material, the filler, and the light diffusing member also by printing, potting, electrodeposition, and stamping. The encapsulating member can be applied to the upper surface thereof. This makes optical design easy in the case where the encapsulating member has a lens shape and enables a high-quality semiconductor device to be obtained.

EXAMPLES

Below, the semiconductor device and the production method therefor of the present invention will be described by way of examples. The semiconductor devices of Example 1 to 19 are encompassed within the semiconductor device of the first embodiment, and some descriptions may therefore be omitted.

Example 1

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in air at about 150° C. for about 5 hours. It was thus possible to directly bond the light emitting semiconductor element 100 and the base 500.

Example 2

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in air at about 320° C. for about 15 minutes. It was thus possible to directly bond the light emitting semiconductor element 100 and the base 500.

Example 3

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in air at about 150° C. for about 10 hours. It was thus possible to directly bond the light emitting semiconductor element 100 and the base 500.

Example 4

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the metal strip of the sintered alumina ceramics.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in air at about 320° C. for about 1 hour. It was thus possible to directly bond the light emitting semiconductor element 100 and the base 500.

Example 5

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in a nitrogen stream at about 150° C. for about 7 hours. It was thus possible to directly bond the light emitting semiconductor element 100 and the base 500.

Example 6

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in a nitrogen stream at about 320° C. for about 1 hour. It was thus possible to directly bond the light emitting semiconductor element 100 and the base 500.

Example 7

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in a nitrogen stream at about 150° C. for about 15 hours. It was thus possible to directly bond the light emitting semiconductor element 100 and the base 500.

Example 8

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in a nitrogen stream at about 320° C. for about 3 hours. It was thus possible to directly bond the light emitting semiconductor element 100 and the base 500.

Example 9

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in air at about 150° C. for about 3 hours. It was thus possible to directly bond the light emitting semiconductor element 100 and the base 500.

Example 10

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air; ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in air at about 320° C. for about 15 minutes. It was thus possible to directly bond the light emitting semiconductor element 100 and the base 500.

Example 11

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in air at about 150° C. for about 5 hours. It was thus possible to directly bond the light emitting semiconductor element 100 and the base 500.

Example 12

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in air at about 320° C. for about 30 minutes. It was thus possible to directly bond the light emitting semiconductor element 100 and the base 500.

Example 13

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in a nitrogen stream at about 150° C. for about 4 hours. It was thus possible to directly bond the light emitting semiconductor element 100 and the base 500.

Example 14

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in a nitrogen stream at about 320° C. for about 30 minutes. It was thus possible to directly bond the light emitting semiconductor element 100 and the base 500.

Example 15

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in a nitrogen stream at about 150° C. for about 10 hours. It was thus possible to directly bond the light emitting semiconductor element 100 and the base 500.

Example 16

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver oxide 140 thereof was directly in contact with the silver 520 of the base 500. In connection with this mounting, temporary bonding was performed as follows: the lead frame was preheated to about 250° C. in a nitrogen stream, ultrasonic waves of about 60 kHz were applied in the direction from the upper surface of the light emitting semiconductor element 100 toward the base 500 and maintained for about 1 second. Furthermore, permanent bonding was performed as follows: the base 500 temporarily bonded with the light emitting semiconductor element 100 was heated in a nitrogen stream at about 320° C. for about 2 hours. It was thus possible to directly bond the light emitting semiconductor element 100 and the base 500.

Reference Example 1

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in air at about 140° C. for about 24 hours. It was thus possible to directly bond the light emitting semiconductor element 100 and the base 500.

Results of Measurement

The die shear strength of the semiconductor devices of Examples 1 to 16 and Reference Example 1 was measured. For the measurement of die shear strength, a shearing force was applied at room temperature in a direction stripping the light emitting semiconductor element 100 off the base 500, and the intensity of the force when the light emitting semiconductor element 100 was stripped off was determined. Moreover, the light reflectivity for light having a wavelength of 470 nm of the semiconductor devices of Examples 1, 2, 5, 6, 9, 10, 13, and 14 that used a package was measured. The results of the die shear strength (gf) and light reflectivity (%) measurement are presented in Table 1.

TABLE 1

| Example | Die shear strength (gf) | Light reflectivity (%) |
|---|---|---|
| Example 1 | 512.7 | 87 |
| Example 2 | 501.0 | 85 |
| Example 3 | 503.4 | — |
| Example 4 | 530.2 | — |
| Example 5 | 510.3 | 89 |
| Example 6 | 522.3 | 87 |
| Example 7 | 505.9 | — |
| Example 8 | 516.7 | — |
| Example 9 | 510.4 | 88 |
| Example 10 | 520.6 | 85 |
| Example 11 | 500.3 | — |
| Example 12 | 544.1 | — |
| Example 13 | 520.5 | 90 |
| Example 14 | 514.8 | 88 |
| Example 15 | 538.2 | — |
| Example 16 | 565.3 | — |
| Ref. Ex. 1 | 238.2 | 84 |

According to the results of the measurement, it was found that the higher the temperature of the permanent bonding, the shorter the time taken to attain the desired die shear strength. It was found that a practical die shear strength can be obtained by selecting a temperature of 150° C. or greater and a suitable heating time. Although the temperature of 320° C. was employed in view of the heat resistance of the package and the light emitting semiconductor element, higher temperatures can be employed when a package and a semiconductor element of greater heat resistance are used. It was found that bonding can be accomplished in a nitrogen stream by providing silver oxide on the light emitting semiconductor element side. Although not presented as an example, bonding can be similarly accomplished in a nitrogen stream in a semiconductor device in which silver oxide is provided on the base side.

The light reflectivity obtained in the examples was all 85% or greater and very high. Moreover, it was possible to alleviate the reduction in light reflectivity resulting from the discoloration of the epoxy resin used in the package. Use of a ceramics component for the base can provide a semiconductor device that does not undergo thermal degradation.

On the other hand, although bonding was accomplished at a heating temperature of 140° C. in Reference Example 1, the die shear strength was not sufficient.

Note that, because of the difference between the thermal conductivities of the ceramics component used for the base and the epoxy resin as well as other reasons, the time taken to achieve the desired die shear strength may sometimes be different even when the same temperature was applied.

Examples 17 to 19

For a light emitting semiconductor element 100, a translucent inorganic sapphire substrate 110 having the dimensions of 600 µm×600 µm×100 µm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in air at about 320° C. for 3 different durations, i.e., about 1 hour (Example 17), about 2 hours (Example 18), and about 3 hours (Example 19). It was thus possible to directly bond the light emitting semiconductor element 100 and the base 500.

Results of Measurement

The die shear strength of the semiconductor devices of Examples 17 to 19 was measured. For the measurement of die shear strength, a shearing force was applied at room temperature in a direction stripping the light emitting semiconductor element 100 off the base 500, and the intensity of the force when the light emitting semiconductor element 100 was stripped off was determined. The results of the die shear strength (gf) measurement are presented in Table 2.

TABLE 2

| Example | Die shear strength (gf) |
|---|---|
| Example 17 | 1824.3 |
| Example 18 | 1907.6 |
| Example 19 | 1978.4 |

According to these results, it was found that the longer the heating time, the greater the die shear strength. Moreover, it was demonstrated that permanent bonding performed at 320° C. can give a die shear strength of about 2000 gf (55 MPa).

Initial Properties

Comparative Example 1

Bonding was performed using the same components as in Example 1 except that a clear colorless insulative epoxy resin was used as a die bonding component in Comparative Example 1. Curing was performed at 170° C. for 1 hour. The die shear strength attained in Comparative Example 1 was about 900 gf.

Comparative Example 2

Bonding was performed using the same components as in Example 1 except that a silver paste containing 80 wt % of a flaky silver filler and 20 wt % of an epoxy resin was used in Comparative Example 2. Curing was performed at 150° C. for 1 hour. The die shear strength attained in Comparative Example 2 was about 1500 gf.

Results of Measurement

In connection with Example 1, Comparative Example 1, and Comparative Example 2, the electrode of the light emitting semiconductor element and the electrode of the base were gold-wired and encapsulated in a silicone resin, thereby giving a semiconductor device. The emission intensity of each semiconductor device as-is was measured. The emission intensity is presented as a value relative to the intensity obtained in Example 1 being 100%. Table 3 shows the results of measurement.

TABLE 3

| | Bonding | Relative intensity of emission (%) |
|---|---|---|
| Ex. 1 | Direct Ag bonding | 100 |
| Comp. Ex. 1 | Bonding with insulative epoxy resin | 95 |
| Comp. Ex. 2 | Bonding with flaky silver filler-containing epoxy resin | 85 |

As can be understood from the results of measurement, a semiconductor device that had the highest emission intensity was obtained from Example 1. It can be presumed that the emission intensity was lower in Comparative Example 1 because the insulative epoxy resin formed a fillet and, in addition, the color of the epoxy resin turned slightly yellow when cured. Similarly, it can be presumed that the intensity of emission was much lower in Comparative Example 2 because the flaky silver filler-containing epoxy resin formed a fillet and, in addition, the color of the epoxy resin turned slightly yellow when cured and, simultaneously, light scattering due to the flaky silver filler occurred.

Power-On Test

An electric current was applied to the semiconductor devices of Example 1, Comparative Example 1, and Comparative Example 2 as-is (test conditions: 25° C. and 50 mA) for 500 hours, 1000 hours, and 2000 hours, and the emission intensity was then measured. Table 4 shows the intensity relative to the initial intensity

TABLE 4

|  | Bonding | After 500 hours | After 1000 hours | After 2000 hours |
|---|---|---|---|---|
| Ex. 1 | Direct Ag bonding | 99% | 99% | 99% |
| Comp. Ex. 1 | Bonding with insulative epoxy resin | 95% | 80% | 60% |
| Comp. Ex. 2 | Bonding with flaky silver filler-containing epoxy resin | 93% | 75% | 60% |

It was demonstrated that the semiconductor device obtained in Example 1 can maintain high emission intensity even after 2000 hours. On the other hand, it was demonstrated that the semiconductor devices obtained in Comparative Examples 1 and 2 exhibited severely impaired intensity after 2000 hours.

Furthermore, it was demonstrated that no discoloration can be observed in the periphery of the light emitting semiconductor element of Example 1 even after 2000 hours. On the other hand, it was demonstrated that the color of the clear colorless insulative epoxy resin of Comparative Example 1 disposed for bonding between the light emitting semiconductor element and the base as well as the fillet portions was dark reddish brown after 2000 hours. Moreover, it was demonstrated that the color of the silver paste containing 80 wt % of a flaky silver filler and 20 wt % of an epoxy resin of Comparative Example 2 disposed for bonding between the light emitting semiconductor element and the base as well as the fillet portions was dark reddish brown after 2000 hours.

Example 20

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. In connection with this mounting, bonding was performed as follows: the lead frame was preheated to about 250° C. in air, a pressure of about 15 MPa was applied in the direction from the upper surface of the light emitting semiconductor element 100 toward the base 500, and heating was performed at about 250° C. for about 1 hour. It was thus possible to directly bond the light emitting semiconductor element 100 and the base 500. Carrying out temporary bonding and permanent bonding in one step can simplify the process.

Example 21

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

The light emitting semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the light emitting semiconductor element 100 toward the base 500 and maintained for about 10 seconds. Furthermore, permanent bonding was performed as follows: the base 500 temporarily bonded with the light emitting semiconductor element 100 was heated in air at about 380° C. for about 5 minutes. It was thus possible to directly bond the semiconductor light emitting element 100 and the base 500 in a short time.

Example 22

For a semiconductor device 100, a Zener diode was used in place of a light emitting semiconductor element. For the semiconductor element 100, an Si substrate 110 having the dimensions of 300 μm×300 μm×200 μm (thickness), on the upper surface of which was formed a semiconductor layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the semiconductor element 100 toward the base 500 and maintained for about 10 seconds. Furthermore, permanent bonding was performed as follows: the base 500 temporarily bonded with the semiconductor element 100 was heated in air at about 150° C. for about 5 hours. It was thus possible to directly bond the semiconductor element 100 and the base 500 in a short time. Use of a light emitting diode and a Zener diode in one package allows them to be permanently bonded simultaneously after accomplishing the temporary bonding of the light emitting diode and the temporary bonding of the Zener diode, and it was thus possible to simplify the production process.

Example 23

For a semiconductor device 100, an IC chip was used in place of a light emitting semiconductor element. For the semiconductor element 100, an inorganic Si substrate 110 having the dimensions of 300 μm×300 μm×200 μm (thickness), on the upper surface of which was formed a semiconductor layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The semiconductor element 100 was mounted such that the silver 140 thereof was directly in contact with the silver 520 of the base 500. In connection with this mounting, temporary bonding was performed as follows: the lead frame was preheated to about 250° C. in air, a pressure of about 15 MPa was applied in the direction from the upper surface of the semiconductor element 100 toward the base 500 and maintained for about 10 seconds. Furthermore, permanent bonding was performed as follows: the base 500 temporarily bonded with the light emitting semiconductor element 100 was heated in air at about 380° C. for about 5 minutes. It was thus possible to directly bond the semiconductor element 100 and the base 500 in a short time.

The method for producing a semiconductor device of the present invention is applicable to, for example, the connection of component electrodes, die attaching, fine-pitch bumping, flat panels, solar wiring and like production applications, and wafer connection and like applications as well as to the production of electronic parts produced by assembling such components. Moreover, the method for producing a semiconductor device of the present invention is applicable when, for example, semiconductor devices that use light emitting semiconductor elements such as LEDs and LDs are produced.

Description of Reference Numerals
100, 200, 300: Light emitting semiconductor element
110, 210, 310: Translucent inorganic substrate
120, 220, 320: Semiconductor layer
121, 221, 321: N-type semiconductor
122, 222, 322: P-type semiconductor
130, 330: Electrode
131, 331: N-type electrode
132, 232, 332: P-type electrode
140, 240, 340: Silver or silver oxide
150, 250: First silver
160, 260: Buffering member
500, 600, 700: Base
510, 610, 710: Pedestal
520, 620, 720: Silver or silver oxide The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device having a die shear strength of 13 to 55 MPa in which silver or silver oxide provided on a surface of a base and silver or silver oxide provided on a surface of a semiconductor element are directly bonded,
wherein the semiconductor element includes a translucent inorganic substrate and a semiconductor layer formed on the translucent inorganic substrate, and
the silver or silver oxide provided on the surface of the semiconductor element is located on the side of the semiconductor element opposite to the side on which the semiconductor layer is formed.

2. The semiconductor device according to claim 1, wherein the semiconductor element is a light emitting semiconductor element.

3. The semiconductor device according to claim 1, wherein the translucent inorganic substrate is provided with a first silver on the side opposite to the side on which the semiconductor layer is formed and is furnished with a buffering member that is bonded with the first silver, and silver or silver oxide is provided on a surface of the buffering member.

4. The semiconductor device according to claim 2, wherein the thickness of the silver or silver oxide provided on a surface of the light emitting semiconductor element is 0.1 to 50 μm.

5. The semiconductor device according to claim 2, wherein two or more layers of the silver or silver oxide is provided on a surface of the light emitting semiconductor element.

6. The semiconductor device according to claim 3, wherein the thickness of the first silver is 0.05 μm or greater.

7. The semiconductor device according to claim 3, wherein the buffering member is made by an inorganic or organic material.

8. The semiconductor device according to claim 3, wherein the buffering member contains at least one selected from the group consisting of gold, copper, aluminium, tin, cobalt, iron, and indium, tungsten as well as alloys thereof; silica, alumina, zirconium oxide, and titanium oxide; and aluminium nitride, zirconium nitride, and titanium nitride.

9. The semiconductor device according to claim 3, wherein the buffering member contains at least one selected from the group consisting of insulative resin of an epoxy resin, a silicone resin, a modified silicone resin, and a polyimide resin; and conductive resins that are produced by filling insulative resins with metal powder.

10. The semiconductor device according to claim 3, wherein the buffering member is made by multiple layers.

11. The semiconductor device according to claim 1, wherein the base is at least one selected from the group consisting of a metal substrate, a lead frame, a glass epoxy board, a BT resin substrate, a glass substrate, a resin substrate and paper.

12. The semiconductor device according to claim 1, wherein the base is a resin package.

13. The semiconductor device according to claim 1, wherein the shape of the base is a flat plate shape or a cup shape.

14. The semiconductor device according to claim 1, wherein the semiconductor element is covered by an encapsulating member.

15. The semiconductor device according to claim 14, wherein the encapsulating member contains a fluorescent material, a filler, or a light diffusing member.

16. The semiconductor device according to claim 1, wherein the translucent inorganic substrate is provided with a first silver on a side opposite to the side on which the semiconductor layer is formed.

* * * * *